United States Patent [19]

Nakagawa et al.

[11] Patent Number: 5,140,110
[45] Date of Patent: Aug. 18, 1992

[54] PRINTED CIRCUIT BOARD CAPABLE OF PREVENTING ELECTROMAGNETIC INTERFERENCE

[75] Inventors: Katsuya Nakagawa; Masakazu Nagano; Jun Higashiyama, all of Kyoto, Japan

[73] Assignee: Nintendo Co. Ltd., Kyoto, Japan

[21] Appl. No.: 749,758

[22] Filed: Aug. 26, 1991

Related U.S. Application Data

[60] Continuation of Ser. No. 482,936, Feb. 22, 1990, which is a continuation-in-part of Ser. No. 303,281, Jan. 26, 1989, abandoned, which is a division of Ser. No. 25,106, Mar. 12, 1987, Pat. No. 4,801,489.

[51] Int. Cl.⁵ .............................................. H05K 1/00
[52] U.S. Cl. ...................................... 174/250; 174/260
[58] Field of Search ............... 174/250, 258, 260, 262, 174/267, 35 R; 361/397, 398, 400, 409, 412; 428/901

[56] References Cited

U.S. PATENT DOCUMENTS 4,362,899 12/1982 Borrill ........................... 361/409 X
4,801,489 1/1989 Nakagawa et al. ........ 174/35 R X Primary Examiner—Leo P. Picard
Assistant Examiner—Trinidad Korka
Attorney, Agent, or Firm—Nixon & Vanderhye

[57] ABSTRACT

A printed circuit board includes a first electric conductive layer formed on an insulating base plate to form signal patterns and a ground pattern. An insulation layer covering the signal patterns and a second electric conductive layer connected to the ground pattern are sequentially formed on the plate. A large area ground land is formed in the vicinity of a ground terminal of a digital IC by the first electric conductive layer to be connected to the ground terminal, which is directly surface-connected to the second electric conductive layer so that a ground impedance of the ground terminal can be reduced. A large area power source land connected to a power source terminal of the digital IC is formed in the vicinity of the power source terminal by the first electric conductive layer, which sandwiches the insulation layer in cooperation with the second electrostatic conductive layer so that an electrostatic capacitance larger than a line-to-line distribution capacitance formed by the signal patterns can be formed between the power source land and the second electric conductive layer.

6 Claims, 7 Drawing Sheets

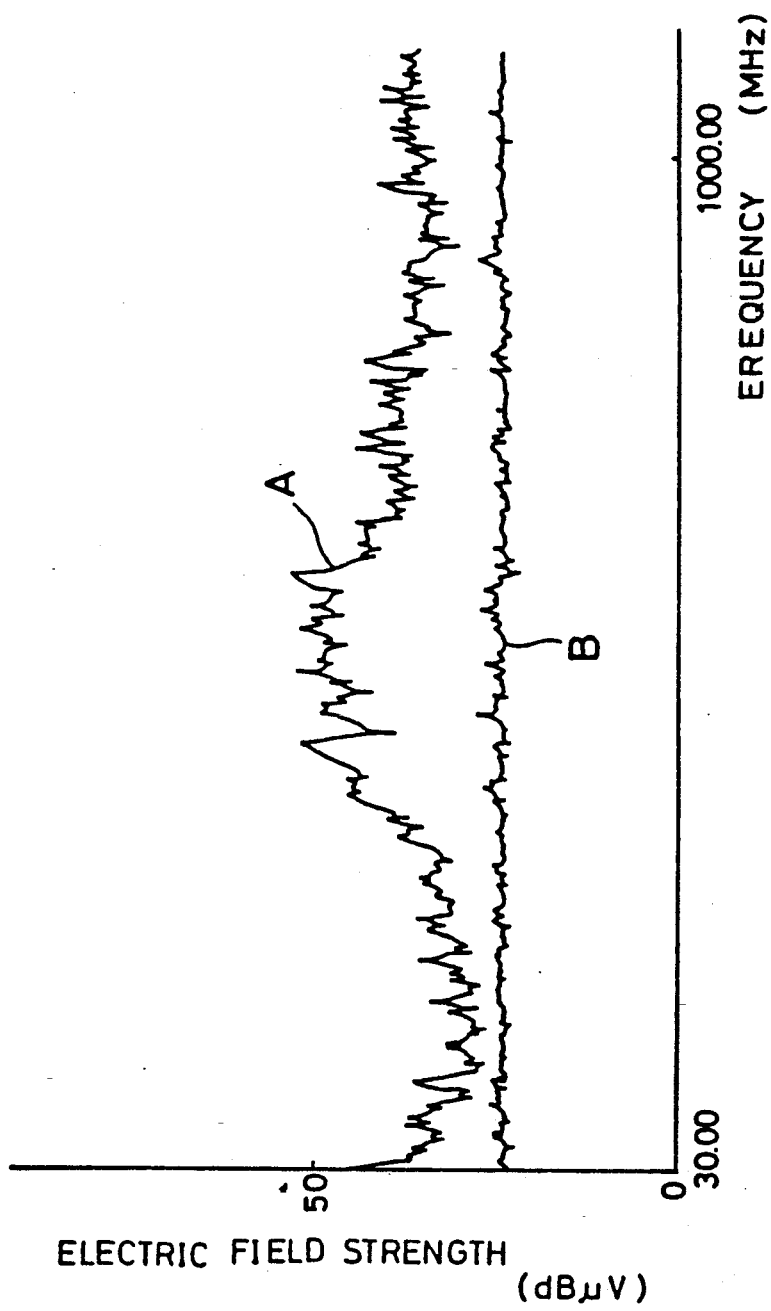

PRINTED CIRCUIT BOARD CAPABLE OF PREVENTING ELECTROMAGNETIC INTERFERENCE

This is a continuation of application Ser. No. 07/482,936, filed Feb. 22, 1990, which is a continuation-in-part of application Ser. No. 07/303,281, filed Jan. 26, 1989, now abandoned, which is a divisional of application Ser. No. 07/025,106, filed Mar. 12, 1987, now U.S. Pat. No. 4,801,489.

BACKGROUND OF THE INVENTION

1. Field of the Invention

The present invention relates to a printed circuit board capable of preventing electromagnetic interference. More specifically, the present invention relates to a printed circuit board capable of preventing electromagnetic interference comprising a first electrically conductive layer which forms a signal pattern and a ground pattern, an insulation layer covering the first conductive layer, and a second electrically conductive layer formed on the insulation layer to be connected to the ground pattern.

2. Description of the Prior Art

Digital IC's such as a microcomputer, microprocessor, etc., are used in various electronic equipment, personal computers, video game machines, etc. Where such a digital IC is mounted on a printed circuit board, the printed circuit board itself becomes a radiation source, and therefore, noise in the form of electromagnetic interference (EMI) is radiated in the air (a) from the printed circuit board itself or (b) through an antenna which is formed by a cord or cable connected to the printed circuit board. If no attempt is made to reduce the EMI noise, the EMI noise functions as an interference radio wave to other electronic components, that is, the EMI noise may cause reception noise in a television receiver or various control components to malfunction. Therefore, the EMI noise must be reduced as much as possible.

Conventionally, with respect to the above described cause (a), a shielding technique is utilized. For example, a printed circuit board is covered by a shield plate such as a metal plate, expanded metal or the like which is connected to the ground so as to pass the EMI noise to the ground therethrough, whereby the EMI noise can be prevented from being radiated outside. In addition, with respect to the above described cause (b), a connector which incorporates a specific capacitor is utilized for connecting the cord or cable. However, in such prior art, it is not possible to completely prevent the EMI noise.

In addition, for example, in Japanese Utility Model Publication No. 55-29276, one example of a method for shielding is disclosed, wherein a silver paste is formed on the base plate to shield the base plate. However, this method is merely a modification of the above described shielding technique and directed to reduce spurious noise rather than the EMI noise. Such spurious noise has low-frequency components less than 10 MHz and is regularly generated. Therefore, the method disclosed in Japanese Utility Model Publication No. 55-29276 is effective for the spurious noise but is not effective for the EMI noise from a digital IC, which has very high-frequency components of 30–1000 MHz and is generated irregularly. Furthermore, the method disclosed in Japanese Utility Model Publication No. 55-29276 can not deal with the connection of the cord or cable.

Therefore, a novel printed circuit board was proposed capable of preventing EMI in accordance with a novel idea in Japanese Patent Laid-open No. 62-213192 corresponding to the inventor's assignee's U.S. Pat. No. 4,801,489. Thus printed circuit board capable of preventing the EMI includes an insulation layer formed on an insulating base plate so as to cover a first electric conductive layer formed on the insulating base plate, and a second electric conductive layer is further formed on the insulation layer by means of printing of a copper ink or paste. The proposed printed circuit board is effective in some cases, but it is desired to further improve the EMI noise preventing function of a printed circuit board.

SUMMARY OF THE INVENTION

Therefore, a principal object of the present invention is to provide an improved printed circuit board capable of preventing electromagnetic interference, which can effectively reduce the electromagnetic interference noise.

One aspect in accordance with the present invention is a printed circuit board capable of preventing electromagnetic interference which comprises an insulating base plate; a first electrically conductive layer formed on the insulating base plate, said first electrically conductive layer forming a signal pattern and a ground pattern; an insulation layer formed on the first electric conductive layer so as to cover at least the signal pattern; and a second electrically conductive layer formed on the insulation layer and electrically connected to the ground pattern, the printed circuit board is characterized in that a large area ground land is formed to be connected to a ground terminal of a digital IC in the vicinity of the ground terminal of the digital IC by the first electrically conductive layer, wherein the second electrically conductive layer and the ground land are directly surface-connected each other so that the ground impedance of the ground terminal of the digital IC can be reduced.

A second aspect in accordance with the present invention is a printed circuit board capable of preventing electromagnetic interference which comprises an insulating base plate; a first electrically conductive layer formed on the insulating base plate, said first electrically conductive layer forming a signal pattern and a ground pattern; an insulation layer formed on the first electric conductive layer so as to cover at least the signal pattern; and a second electrically conductive layer formed on the insulation layer and electrically connected to the ground pattern, the printed circuit board is characterized in that a large area power source land is formed to be connected to a power source terminal of a digital IC in the vicinity of the power source terminal by the first electrically conductive layer, wherein the power source land sandwiches the insulation layer in cooperation with the second electrically conductive layer so that an electrostatic capacitance larger than a line-to-line distributed capacitance formed by the signal pattern can be formed between the power source land and the second electric conductive layer.

A third aspect in accordance with the present invention is a printed circuit board capable of preventing electromagnetic interference which comprises an insulating base plate; a first electrically conductive layer formed on the insulating base plate, said first electrically conductive layer forming a signal pattern and a ground pattern; an insulation layer formed on the first electrically conductive layer so as to cover at least the signal pattern; and a second electrically conductive layer formed on the insulation layer and electrically connected to the ground pattern, the printed circuit board is characterized in that a large ground land is formed to be connected to a ground terminal of a connector in the vicinity of the ground terminal by the first electric conductive layer, wherein the second electrically conductive layer is directly surface-connected to the ground land so that the ground impedance of the ground terminal of the connector can be reduced, and that a large area capacitance land is formed to be connected to the other terminal of the connector in the vicinity of the other terminal by the first electrically conductive layer, wherein the capacitance land sandwiches the insulation layer in cooperation with the second electric conductive layer so that an electrostatic capacitance larger than a line-to-line distributed capacitance formed by the signal pattern can be formed between the capacitance land and the second electrically conductive layer.

Since the large area ground land is directly surface-connected to the second electrically conductive layer, the ground impedance of the ground land, that is, the ground terminal of the digital IC connected thereto is minimized. In a conventional printed circuit board, since a ground pattern was typically formed without any specific consideration, the ground pattern itself has an inductance component, and therefore, the ground pattern did not become an ideal ground with respect to the EMI noise having high-frequency components of 30-1000 MHz, and thus, there was a case where a weak or small induction energy is generated by a flow of a wide variety of high-frequency currents. By contrast, in the present invention, since the ground impedance is minimized by the ground land being directly surface-connected to the second electric conductive layer, no induction energy is generated, and therefore, the EMI noise due to the induction energy can be effectively suppressed.

In addition, since the large area power source land and the second electrically conductive layer are opposite each other so as to sandwich the insulation layer, an electrostatic capacitance can be formed therebetween. The electrostatic capacitance becomes larger than the line-to-line distributed capacitance formed between the signal patterns. Therefore, if no power source land is formed, interference between the signal patterns due to a variation in distributed capacitance between the signal patterns, and therefore, a leakage of signal current occurs by an interaction of an electric field and a magnetic field, and EMI noise is resultingly generated. However, the electrostatic capacitance by the power source land is larger than the line-to-line distributed capacitance in the present invention, and therefore, the leakage signal current is completely grounded through the large electrostatic capacitance, and therefore, the EMI noise due to the leakage signal current can be effectively suppressed.

The ground land associated with the ground terminal of the connector can perform the same or similar function as that of the ground land for the digital IC.

Furthermore, an electrostatic capacitance larger than the line-to-line distributed capacitance of the signal pattern is formed by the capacitance land which is formed in association with the other terminal of the connector, whereby a line-to-line characteristic impedance between the signal patterns is lowered, and therefore, energy stored in the other terminal, that is, other signal pattern becomes small, and thus, the EMI noise due to the stored energy can be suppressed. More specifically, the signal pattern has an inductance component, and therefore, energy is stored in the signal pattern due to a mismatching with respect to a small input impedance of the digital IC, for example, and the stored energy is radiated as EMI noise. This is remarkable at a point where the signal pattern is folded or curved. By contrast, since a large electrostatic capacitance is formed by the capacitance land, as described above, the stored energy on the signal pattern becomes small, and therefore, the EMI noise due to the stored energy can be suppressed.

In accordance with the present invention, the EMI noise is very effectively suppressed by the ground land. More specifically, in accordance with the present invention, since the EMI noise component is suppressed from being generated on the printed circuit board, contrast with a conventional board, the printed circuit board itself does not become to a radiating source of the EMI noise. Therefore, when the printed circuit board capable of preventing the EMI in accordance with the present invention is utilized, it becomes unnecessary to use the above described conventional shielding technique, specific connector and the like thereby resulting in a large reduction in expenses.

In addition, if a large electrostatic capacitance is obtained by forming the power source land and/or the capacitance land, it is possible to omit a large number of bypass capacitors which were needed for constructing actual circuitry on the conventional printed circuit board. If discrete capacitors are utilized as these bypass capacitors, a frequency characteristic in a high-frequency region is deteriorated due to the inductance of lead wires thereof, and therefore, such discrete capacitors are not effective with respect to the EMI noise existing in a wide frequency range of 30-1000 MHz. By contrast, it is not necessary to connect the electrostatic capacitance formed by the power source land and the capacitance land by a lead wire, and therefore, no frequency characteristic. deterioration occurs and therefore, such an electrostatic capacitance can effectively function as a bypass capacitor.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 7 is a graph showing advantages of the present invention, wherein a line A shows a case where a printed circuit board having no second electrically conductive layer is utilized and a line B shows a case where a printed circuit board in accordance with the embodiment shown by FIG. 1-FIG. 6B.

DETAIL DESCRIPTION OF THE PREFERRED EMBODIMENTS

Figure 1:
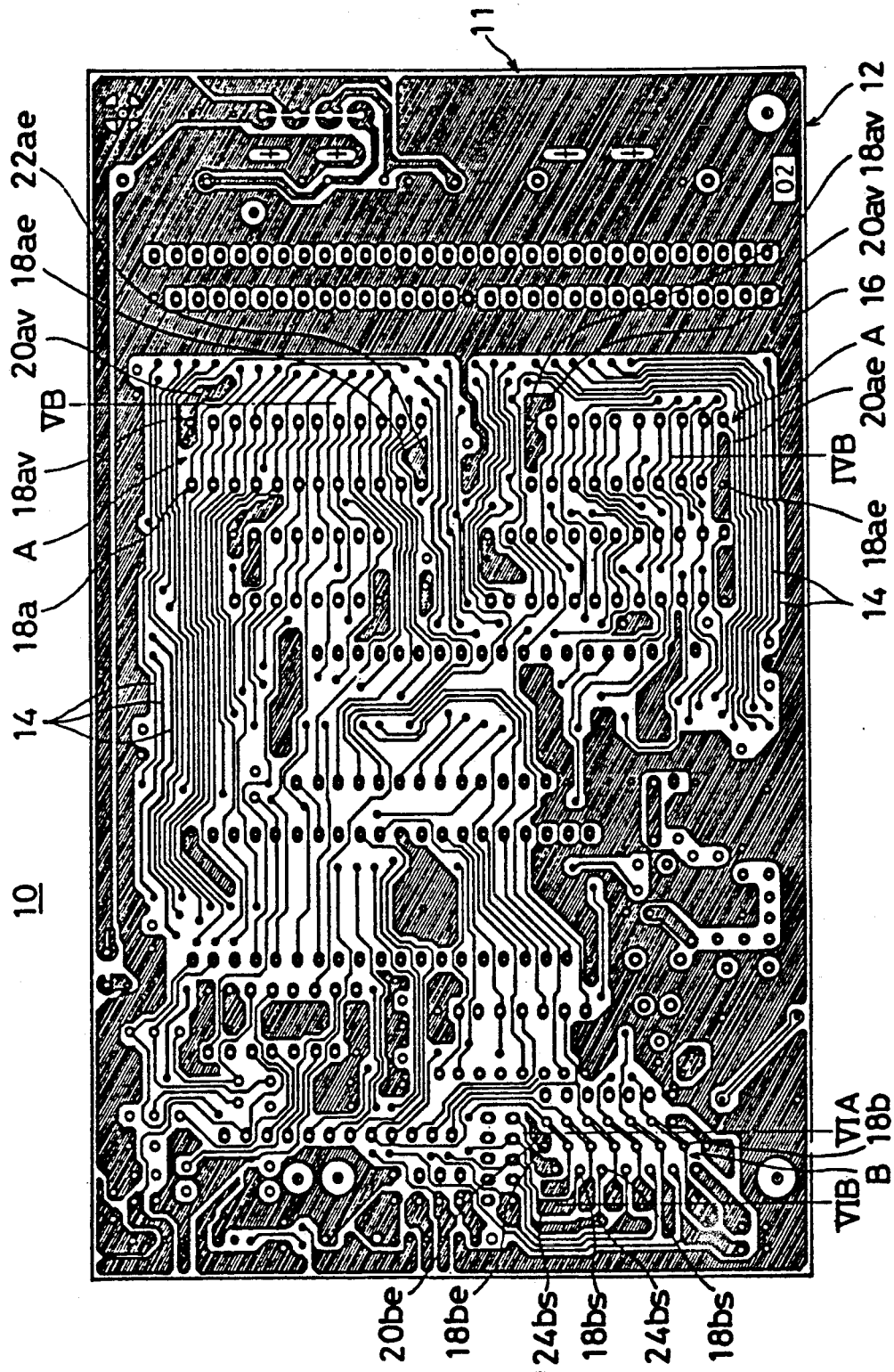
FIG. 1 is a pattern layout showing one example of a first electrically conductive layer formed on an insulating base plate in accordance with an embodiment of the present invention.

With reference to FIG. 1, a printed circuit board capable of preventing electromagnetic interference 10 of this embodiment includes an insulating base plate 12 made of a glass-epoxy, for example, on which a first electrically conductive layer 11 which is shown by oblique lines (hatching lines) and made of a copper foil, for example. Like a conventional printed circuit board, the first electrically conductive layer 11 forms signal patterns 14 on which signals flow and a ground pattern 16.

An area shown by a reference character A is an area where a digital IC (not shown) such as a microcomputer, microprocessor or the like is to be mounted, and an area shown by a reference character B is an area where a connector (not shown) for connecting the printed circuit board 10 to equipment or printed circuit boards other than the printed circuit board 10 is to be mounted.

Focussing on area A, holes, such as hole 18a, are formed for respective terminals (not shown) of a dual-in-line digital IC. A hole 18ae is a hole for inserting a ground terminal of the digital IC, and a ground land 20ae having large area is formed in the vicinity of the hole 18ae. In addition, a hole 18av is a hole for inserting a terminal for power source Vcc of the digital IC, and a power source land 22av having large area is formed in the vicinity of the hole 18av.

Focussing on area B, holes for respective terminals (not shown) of the connector are formed. A hole 18be is a hole for inserting a ground terminal of the connector, and a ground land 20be having large area is formed in the vicinity of the hole 18be. In addition, holes 18bs are holes for inserting signal terminals other than the ground terminals, and capacitance lands 24bs each having large area are formed in the vicinity of the holes 18bs.

Figure 2:
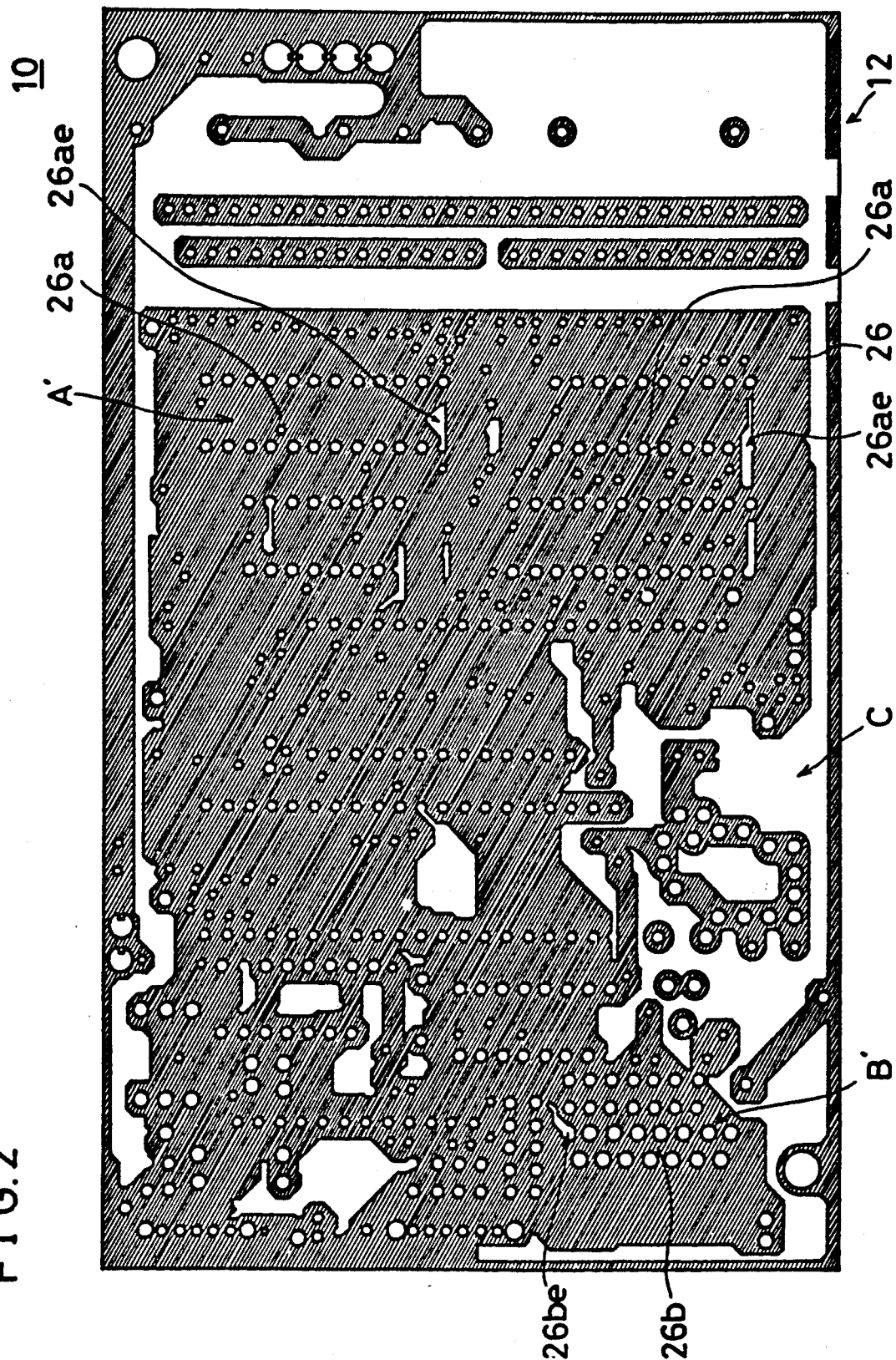
FIG. 2 is a pattern layout showing one example of an insulation layer formed on a first electrically conductive layer.

On such an insulating base plate 12, as shown in FIG. 2, an insulating resin layer 26 shown by oblique lines (hatching lines) is formed so as to cover a portion of the first electrically conductive layer 11, that is, the signal patterns 14 (FIG. 1) and ground patterns 16 (FIG. 1) on the insulating base plate 12. In an area A' corresponding to the above described area A, a hole 26ae having substantially the same form as the ground land 20ae (FIG. 1) is formed in a position corresponding to the ground land 20ae. In a remaining portion of the area A' including the above described power source land 22av, an insulation resin layer 26a is formed. In addition, in an area B' corresponding to the above described area B, a hole 26be having substantially the same form as the ground land 20be (FIG. 1) is formed in a position corresponding thereto. An insulating resin layer 26b is formed in a remaining portion of the area B' including a portion of the above described capacitance land 29bs.

Figure 3:
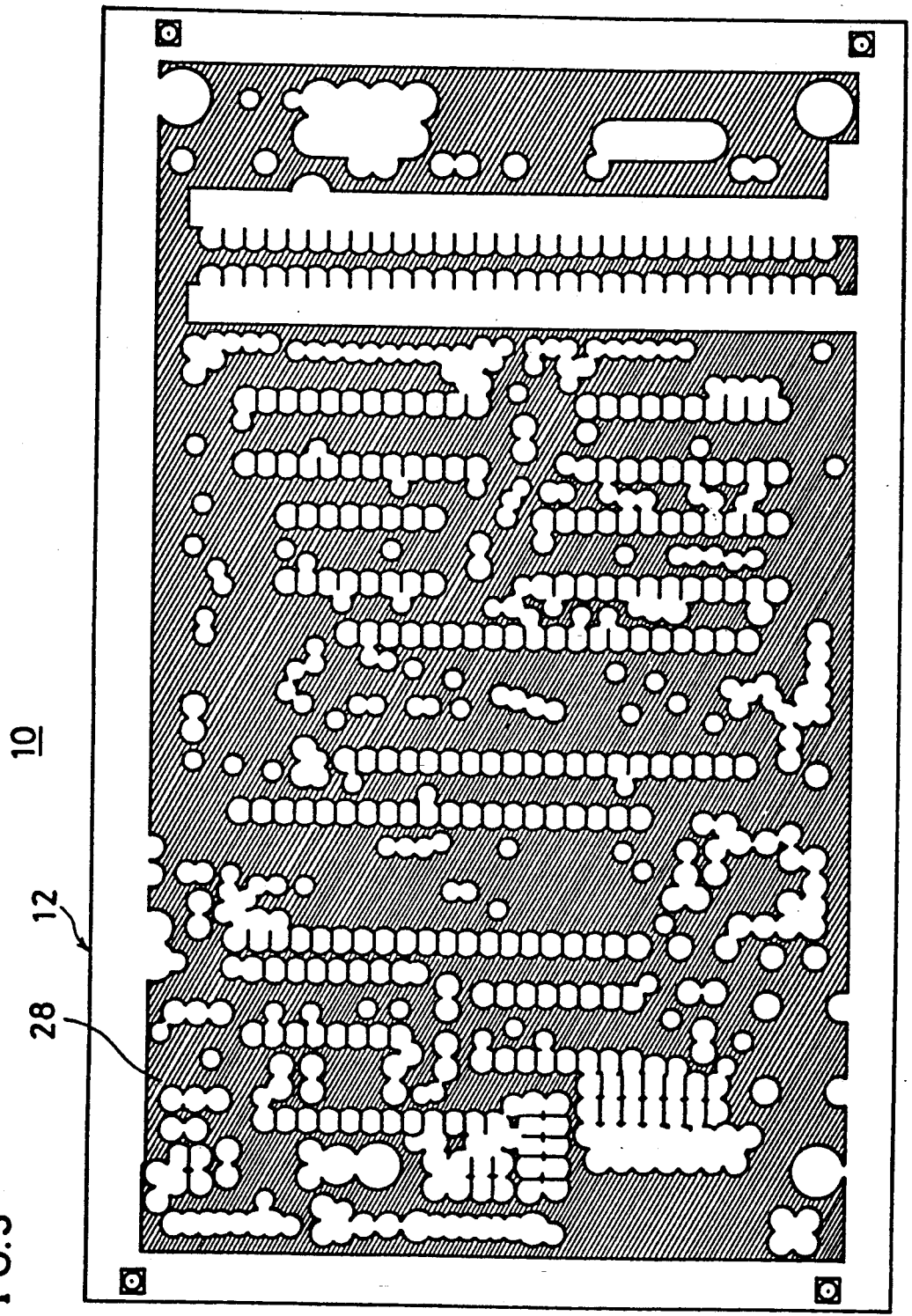
FIG. 3 is a pattern layout showing one example of a second electrically conductive layer formed on an insulation layer.

On the insulating base plate 12, a second electrically conductive layer 28 shown by oblique lines (hatching lines) in FIG. 3 is formed over the insulating resin layer 26 shown in FIG. 2. The second electrically conductive layer 28 may be formed of any of a variety of electrically conductive material. Therefore, the second electric conductive layer 28 may be formed by a copper ink or paste similar to co-pending Japanese Patent Laid-open No. 62-213192 (U.S. Pat. No. 4,801,489). As shown in FIG. 3, the second electrically conductive layer 28 is formed on substantially the whole surface of the insulating base plate 12 so as to be connected to the ground pattern 16 on the insulating base plate 12 at as many as possible portions thereof, for example, in area C shown in FIG. 2.

Figure 4A:
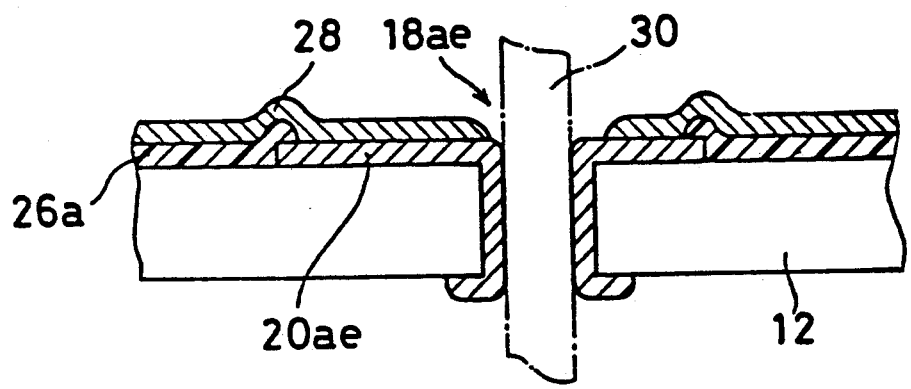
FIG. 4A is a cross-section view showing the vicinity of a hole for a ground terminal of a digital IC.
Figure 4B:
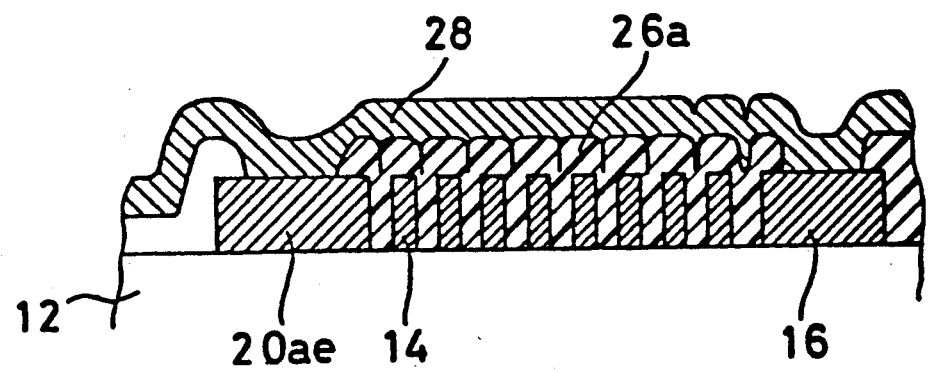
FIG. 4B is a partial cross-section view at a line IVB of FIG. 1 illustrating an insulation layer and respective electric conductive layers.

As shown in FIG. 4A and FIG. 4B, the ground land 20ae surrounding the hole 18ae for the ground terminal of the digital IC is directly surface-contacted with the second electrically conductive layer through the hole 26ae (FIG. 2) of the insulation resin layer 26 having the same form as the ground land 20ae. Therefore, the inductance between the ground land 20ae and the second electrically conductive layer 28 becomes very small, and therefore, the ground impedance of the ground land 20ae, that is, a ground terminal 30 of the digital IC is very small.

Figure 5A:
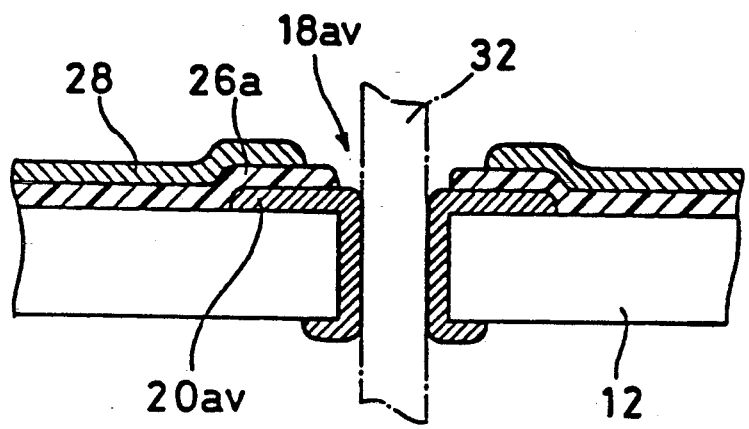
FIG. 5A is a cross-section view showing the vicinity of a hole for a power source terminal of a digital IC.
Figure 5B:
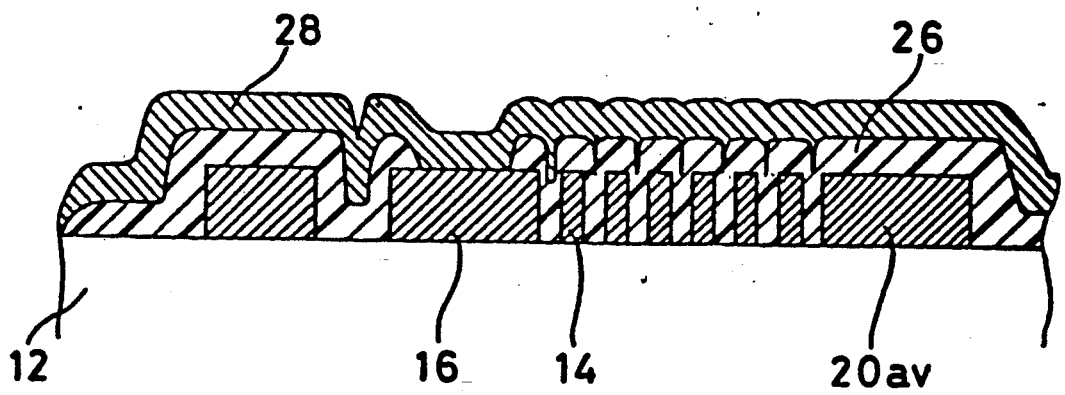
FIG. 5B is a partial cross-section view at a line VB of FIG. 1 illustrating an insulation layer and respective electric conductive layers.

As shown in FIG. 5A and FIG. 5B, the power source land 20av in the vicinity of the hole 18av for the power source terminal of the digital IC is opposite to the second electrically conductive layer 28 via the insulation resin layer 26a. Therefore, a very large electrostatic capacitance can be formed between the power source land 20av and the second electrically conductive layer 28. Such an electrostatic capacitance becomes larger than a line-to-line distributed capacitance formed by signal patterns 14 shown in FIG. 1.

Figure 6A:
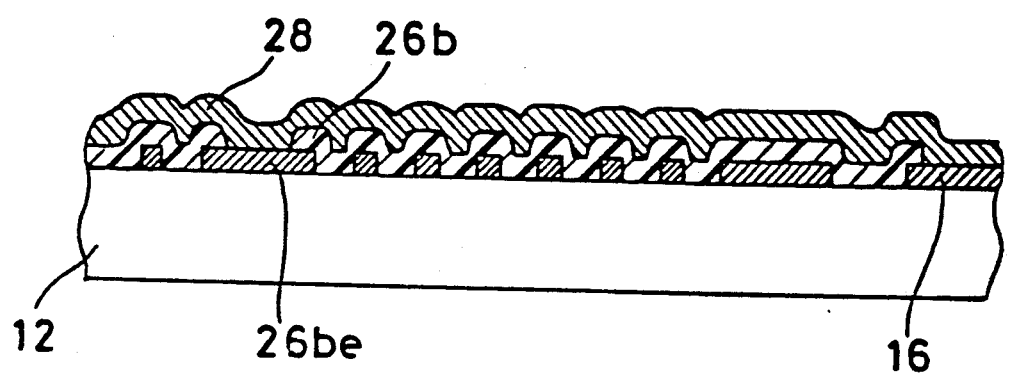
FIG. 6A is a partial cross-section view at a line VIA of FIG. 1 illustrating an insulation layer and respective electrically conductive layers.
Figure 6B:
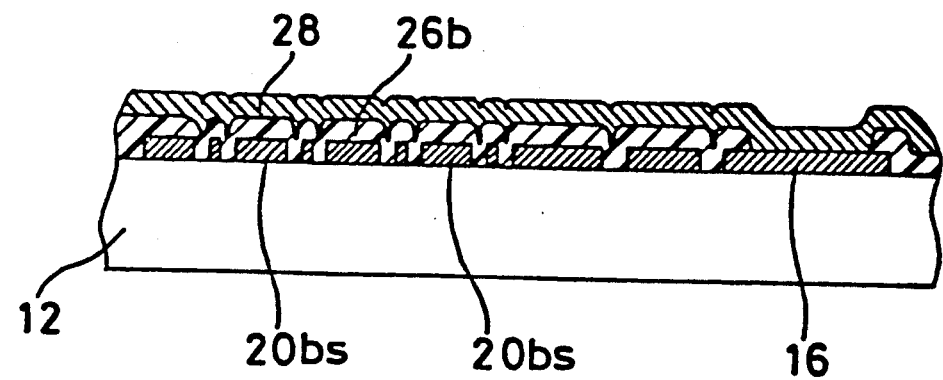
FIG. 6B is a partial cross-section view at a line VIB of FIG. 1.

Similarly, as shown in FIG. 6A, the ground land 20be in the vicinity of the hole 18be (FIG. 1) for the ground terminal of the connector is in direct surface-contact with the second electrically conductive layer 28 through the hole 26be (FIG. 2) of the insulation resin layer 26 having the same form as the ground land 20be. Therefore, an inductance between the ground land 20be and the second electric conductive layer 28 becomes very small, and the ground impedance of the ground land 20be, that is, the ground terminal (not shown) of the connector is very small. In addition, as shown in FIG. 6B, the capacitance lands 20bs in the vicinity of the holes 18bs (FIG. 1) for signal terminals of the connector are opposite to the second electrically conductive layer 28 via the insulating resin layer 26. Therefore, a very large electrostatic capacitance is formed between respective one of the capacitance lands 20bs and the second electrically conductive layer 28. The electrostatic capacitance becomes larger than the line-to-line distributed capacitance formed by the signal patterns 14 shown in FIG. 1.

In accordance with the above described embodiment, as shown by a line B in FIG. 7, it is confirmed by the inventors that no EMI noise occurs in a frequency range of 30-1000 MHz. In addition, a line A in FIG. 7 shows an EMI noise level of a case where a former printed circuit board having no second electrically conductive layer.

In addition, in the embodiment shown, lead wires of electronic components and terminals of a connector are inserted through the holes of the printed circuit board; however, it is needless to say that the present invention can be applied to a printed circuit board of a so-called surface-mounting type.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A printed circuit board capable of preventing electromagnetic interference on which is mounted at least a digital IC having a power source terminal, a ground terminal, and a plurality of signal terminals and another electronic component having at least one connecting terminal, comprising:

an insulating base plate having a first plane area and being formed with a first plurality of throughholes in which the terminals of said digital IC may be inserted;

a first electrically conductive layer formed on said insulating base plate, said first electrically conductive layer including:

a plurality of connecting regions each having a second plane area smaller than said first plane area of said insulating base plate and formed in association with a corresponding one of said first plurality of throughholes at a location where said digital IC is mounted on said insulating base plate;

a ground pattern having a third plane area smaller than said first plane area of said insulating base plate and substantially larger than said second plane area of each of said connecting regions, said ground pattern being arranged at a position on said insulating base plate apart from said plurality of connecting portions;

at least one signal pattern having a small width and being formed so as to electrically connect at least one of said plurality of signal terminals of said digital IC inserted in at least one of said first plurality of throughholes to a connecting terminal of said another electronic component;

a ground pattern having a small width and being formed so as to electrically connect at least one of said connecting regions to which said ground terminal of said digital IC should be connected and said ground pattern; and a first ground land having a fourth plane area substantially larger than said second plane area of each of said plurality of connecting regions and smaller than said third plane area of said ground pattern, said first ground land being formed close to at least one of said plurality of connecting regions to which said ground terminal of said digital IC should be connected;

an insulation layer formed on said insulating base plate so as to cover said signal pattern, said ground pattern and said first ground land remaining substantially exposed; and a second electrically conductive layer formed on said insulation layer and electrically connected to said ground pattern and said first ground land, wherein a ground impedance of said ground terminal of said digital IC is reduced by connecting said ground terminal of said digital IC inserted in one of said first plurality of throughholes to said ground pattern through said first ground land and said second electrically conductive layer.

2. A printed circuit board in accordance with claim 1, wherein said first electrically conductive layer further includes a power source land formed in a region that surrounds said power source terminal of said digital IC, said power source land having a fifth plane area larger that said second area of one of said connecting regions to which said power source terminal should be connected, wherein said power source land is separated from said secon electrically conductive layer by said insulation layer causing an electrostatic capacitance larger than a line-to-line distribution capacitance formed between said signal pattern and said second electrically conductive layer to be formed between said power source land and said second electrically conductive layer.

3. A printed circuit board in accordance with claim 2, wherein said another electronic component includes a connector including a plurality of connector terminals and a ground terminal and for connecting said printed circuit board to other equipment, and said insulating base plate is formed with a second plurality of throughholes to which said plurality of connector terminals may be inserted, said first electrically conductive layer further including a second ground land formed in a region near said second plurality of throughholes on said insulating base plate and for electrically connecting said ground terminal of said connector inserted in one of said second plurality of throughholes to said second electrically conductive layer, said second ground land having a sixth plane area larger than said second plane area of each of said connecting regions, wherein said ground terminal of said connector is connected to said ground pattern to said second ground land through said second electrically conductive layer to reduce a ground impedance of said ground terminal of said connector.

4. A printed circuit board in accordance with claim 1, wherein said first electrically conductive layer includes a capacitance land formed in a region on said insulating base plate near said connecting regions to which said signal terminals of said digital IC are connected, said capacitance land having a seventh plane large area larger than said second plane area of each of said connecting portions, wherein said capacitance land is separated from said second electrically conductive layer by said insulation layer casuing an electrostatic capacitance larger than a line-to-line distribution capacitance formed between second electrically conductive layer and said signal pattern to be formed between said capacitance land and said second electrically conductive layer.

5. A printed circuit board in accordance with claim 1, wherein said another electronic component includes a connector including a plurality of connector terminals and a ground terminal and for connecting said printed circuit board to other equipment, and said insulating base plate is formed with a second plurality of throughholes to which said plurality of connector terminals may be inserted, said first electrically conductive layer further including a second ground land formed in a region near said second plurality of throughholes on said insulating base plate and for electrically connecting said ground terminal of said connector inserted in one of said second plurality of throughholes to said electrically conductive layer, said second ground land having a sixth plane area larger than said second plane area of each of said connecting regions, wherein said ground terminal of said connector is connected to said ground pattern to said second ground land through said second electrically conductive layer to reduce a ground impedance of said ground terminal of said connector.

6. A printed circuit board in accordance with claim 1, wherein said first electrically conductive layer includes a capacitance land formed in a region on said insulating base plate close to said connecting portions to which said signal terminals of said digital IC are connected, said capacitance land having a seventh plane large area larger than said second plane area of each of said connecting portions, wherein said capacitance land is separated from said second electrically conductive layer by said insulation layer causing an electrostatic capacitance larger than a line-to-line distribution capacitance formed between second electrically conductive layer and said signal pattern to be formed between said capacitance land and said second electrically conductive layer.

* * * * *